(12) United States Patent  
Moore et al.

(10) Patent No.: US 6,483,037 B1  
(45) Date of Patent: Nov. 19, 2002

(54) MULTILAYER FLEXIBLE FR4 CIRCUIT

(75) Inventors: Kevin D. Moore, Hoffman Estates, IL (US); Thomas P. Gall, Northbrook, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/008,422

(22) Filed: Nov. 13, 2001

(51) Int. Cl.[7] .................................................. H05K 1/09
(52) U.S. Cl. ........................ 174/254; 29/835; 361/749
(58) Field of Search ................................ 174/254, 255, 174/256; 361/749, 752; 29/830, 846, 835, 834

(56) References Cited

U.S. PATENT DOCUMENTS

| | | | |
|---|---|---|---|
| 4,025,896 A | | 5/1977 | Hintze et al. |
| 4,335,272 A | * | 6/1982 | Pittenger .................. 174/254 |
| 5,008,496 A | | 4/1991 | Schmidt et al. |
| 5,159,751 A | | 11/1992 | Cottingham et al. |
| 5,170,326 A | | 12/1992 | Meny et al. |
| 5,179,501 A | | 1/1993 | Ocken et al. |
| 5,216,581 A | | 6/1993 | Fisher et al. |
| 5,265,322 A | | 11/1993 | Fisher et al. |
| 5,434,352 A | | 7/1995 | Miyazawa et al. |
| 5,434,362 A | | 7/1995 | Klosowiak et al. |
| 5,761,795 A | * | 6/1998 | Ohta ........................... 29/834 |
| 6,099,745 A | | 8/2000 | McKenney et al. |
| 6,287,021 B1 | * | 9/2001 | Katoh et al. ............... 174/254 |
| 6,292,370 B1 | * | 9/2001 | Anderson et al. ......... 174/254 |

FOREIGN PATENT DOCUMENTS

| | | |
|---|---|---|
| EP | 0 938 252 A2 | 8/1999 |
| JP | 404062885 A * | 2/1992 |

* cited by examiner

Primary Examiner—Albert W. Paladini  
(74) Attorney, Agent, or Firm—S. Kevin Pickens; Thomas V. Miller

(57) ABSTRACT

A flexible circuit (100) includes a first circuit path portion (110) and a second rigid circuit path portion (140) to which electronic components (102) may be coupled. Each circuit path portion (110 and 140) including a resin layer (112 and 142) and an adjacent conductive layer (114 and 144). Each circuit path portion (110 and 140) defining a gap (120 and 150) substantially running along a line corresponding to a desired bend location. A central circuit path portion (130) is disposed between the first circuit path portion (110) and the second rigid circuit path portion (140) and includes a first conductive layer (134) in electrical communication with the first circuit path portion (110) and a second conductive layer (136) in electrical communication with the second rigid circuit path portion (140), so as to provide electrical communication across the gaps (120 and 150). A metal plate (160) is disposed adjacent the second rigid circuit path portion (140).

23 Claims, 2 Drawing Sheets

MULTILAYER FLEXIBLE FR4 CIRCUIT

BACKGROUND OF THE INVENTION

1. Field of the Invention

The present invention relates to electronic circuits and, more specifically, to a flexible electronic circuit.

2. Description of the Prior Art

Electronic circuits operate as the result of the interconnection and interaction of numerous electronic components. Typically, the various electronic components are interconnected using a circuit board.

A rigid printed circuit board includes a substrate in which conductive traces are formed based upon a predetermined pattern. At certain locations on the circuit board, conductive pads are formed to define locations on the circuit board to which electronic components are electrically coupled, for example, by soldering. With all of the required electronic components secured to the circuit board, the conductive traces interconnect the electronic components so that the circuit board becomes operable to perform the functions for which it was designed.

One material that is used in the construction of circuit boards is a type of epoxy glass known as FR4. A typical circuit board will have numerous laminated layers of epoxy glass to provide a relatively stiff, and structurally stable substrate onto which the conductive traces and pads may be formed and to which the electronic components may be secured.

Some circuit applications require the circuit board to be flexible. In some flexible circuit applications, a portion of the circuit board may flex during normal operation of the device to which it is associated. For example, in some applications mechanical components to which the circuits are fixed are required to move relative to each other during normal operation. If numerous interconnections are required between the circuit elements coupled to the respective mechanical components, a wired interconnection may not be practical. Thus, a flexible circuit board is used with the interconnections being formed as conductive traces on the flexible circuit board.

Typical FR4 material has not been used in flexible circuits. As described above, FR4 material is typically a construction of numerous (for example, between about 2–5 layers) layers of glass weaves within an epoxy resin. Once the epoxy resin is cured, the layers become stiff. One substitute material that has been successfully used to form flexible circuits is polyimide. Polyimide, however, is substantially more expensive than FR4.

One useful application for flexible circuit boards is in three-dimensional (3D) packaging. In a 3D packaging application, a planar circuit board is laid out and the circuit elements are secured to the circuit board in this planar form. The planar board is then folded to facilitate packaging of the circuit within a housing and to reduce the volume occupied by the circuit package. Constructing the circuit in a planar form simplifies and facilitates manufacturing using automation. The ability then to fold the circuit board into a more compact volume is a great advantage to the packaging designer, and particularly to the automotive electronic packaging designer, who is frequently faced with space constraints. However, such folding does require at least a portion of the circuit board, where it is to be folded, to be flexible.

Unlike applications where the circuit board must flex repeatedly during normal operation, flexible circuit boards in 3D packaging applications usually need to flex only once when manufactured. Although the circuit board is only required to flex once, it may require forming a bend in the circuit board of relatively small radius. These bending requirements limit construction of the circuit boards to flexible materials, i.e., polyimide, because typical FR4 materials tend to be too brittle to form bends of such small radius. Forming bends in FR4 material of radius less than about 200 mils typically results in cracking of the circuit board, which is an unacceptable defect.

Therefore, there is a need for a flexible circuit board using relatively inexpensive materials.

DETAILED DESCRIPTION OF THE INVENTION

A preferred embodiment of the invention is now described in detail. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 1:
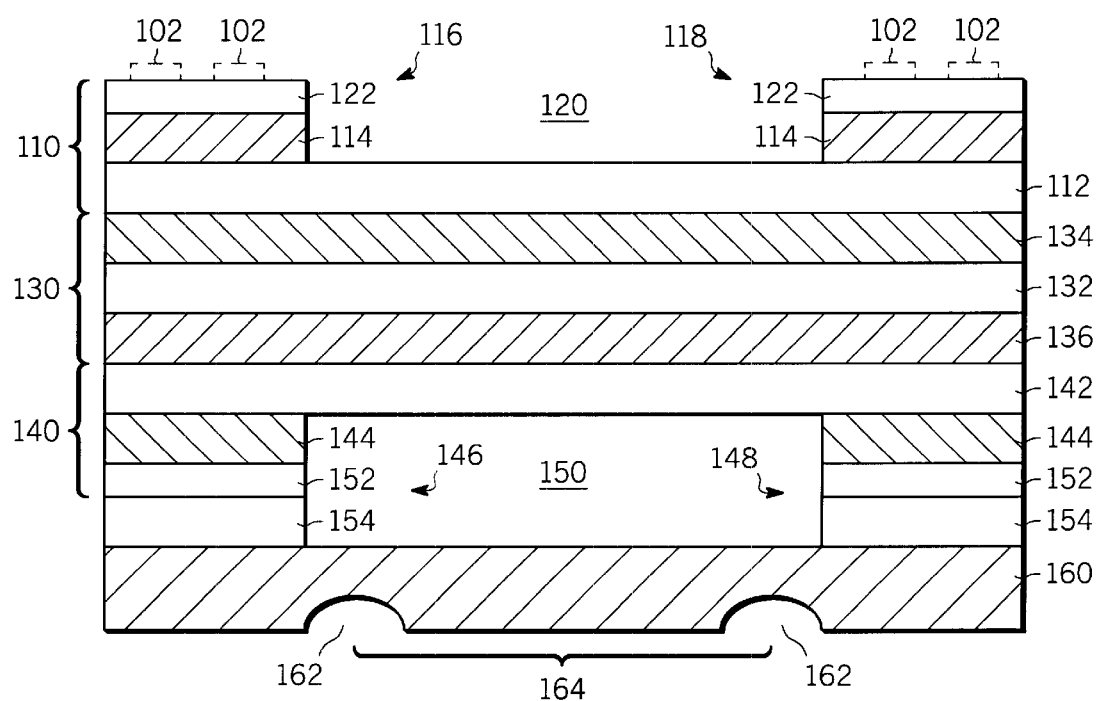
FIG. 1 is a cross sectional view of one embodiment of the invention.
Figure 2:
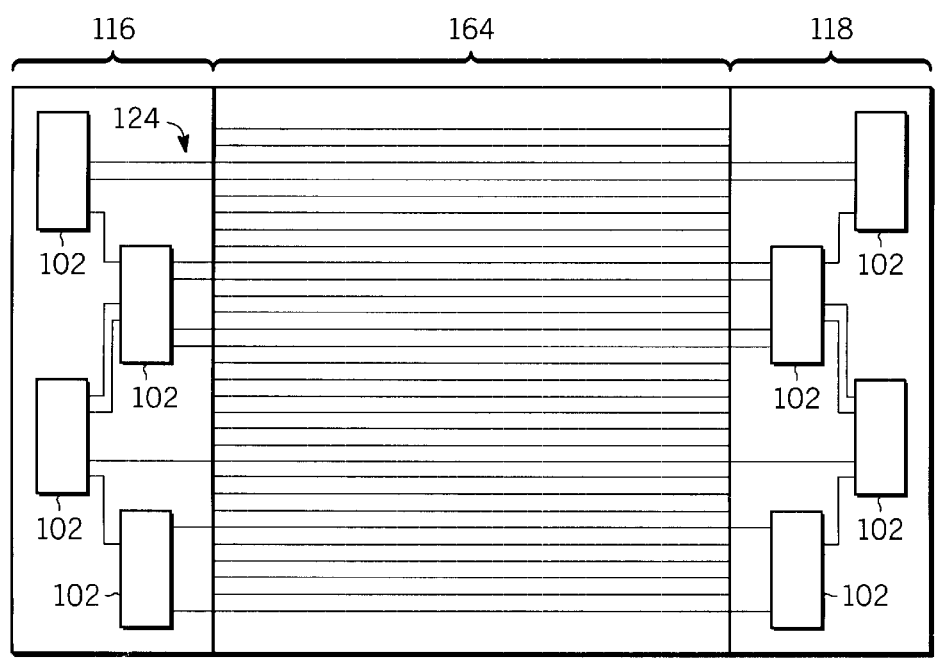
FIG. 2 is a top plan view of one embodiment of the invention that is not yet bent.

As shown in FIGS. 1–2, one illustrative embodiment of the invention is a flexible circuit board 100 that includes a first circuit path portion 110, a second circuit path portion 140, a central circuit path portion 130 and a metal plate 160. Electronic components 102 may be coupled to at least a portion of the first circuit path portion 110.

The first circuit path portion 110 includes a first resin layer 112 and an adjacent first conductive layer 114, which defines at least one first circuit path 124. A solder mask 122 may also be applied to the first conductive layer 114. The combined first conductive layer 114 and solder mask 122 form a first member 116 and a spaced-apart second member 118, with a first gap 120 being defined there-between. The first gap 120 substantially runs along a line corresponding to a desired bend location 164.

Similarly, the second circuit path portion 140 includes a second resin layer 142 and an adjacent second conductive layer 144, which defines at least one second circuit path. The second conductive layer 144 includes a third member 146 and a spaced-apart fourth member 148, a second gap 150. The second conductive layer 144 being defined there-between. The second gap 150 also runs along the line corresponding to the desired bend location 164 and is disposed substantially in parallel with the first gap 120. A second solder mask layer 152 is disposed adjacent the second conductive layer 144 opposite the second resin layer 142.

The central circuit path portion 130 is disposed between the first resin layer 112 and the second resin layer 142. The central circuit path portion 130 includes a third conductive layer 134 disposed adjacent the first resin layer 112 and a fourth conductive layer 136 disposed adjacent the second resin layer 142. A non-conductive base layer 132 is disposed between the third conductive layer 134 and the fourth conductive layer 136. The non-conductive base layer 132 could be made from an FR4 composite, such as an FR4 single ply 1080 glass, or it could be made of another flexible non-conductive material, for example a non-woven arimid fiber base laminate. The material used should be able to withstand both the continuous operating temperature range of the flexible circuit board 100 and its manufacturing temperature range.

The third conductive layer 134 is in electrical communication with the first circuit path 124 in the first conductive layer 114 and thus provides electrical communication between the first member 116 and the second member 118 across the first gap 120. Similarly, the fourth conductive layer 136 is in electrical communication with the second circuit path in the second conductive layer 144 and provides electrical communication between the third member 146 and the fourth member 148 across the second gap 150. Also, the third conductive layer 134 could be in electrical communication with either the fourth conductive layer 136 or the second circuit path (or both) through the use of vias. Similarly, the fourth conductive layer 136 could be in electrical communication with either the third conductive layer 134 or the first circuit path 124 (or both).

The metal plate 160 (for example a 2 mm to 3 mm aluminum plate), which acts as a heat sink and may be employed as a ground, is affixed to the second solder mask 152 with an adhesive layer 154. The metal plate 160 may define at least one elongated notch 162 (referred to in the art as a "coin") that is substantially in alignment with the desired bend location 164 and that provides a local weakness in the metal plate 160 to facilitate accurate bending in the bend area 164. The central circuit path portion 130 can include grounding planes, so there is no need for grounding dots to be welded to the metal plate 160. Therefore, the embodiment disclosed above costs less than prior art devices in terms of materials and manufacturing.

Figure 3:
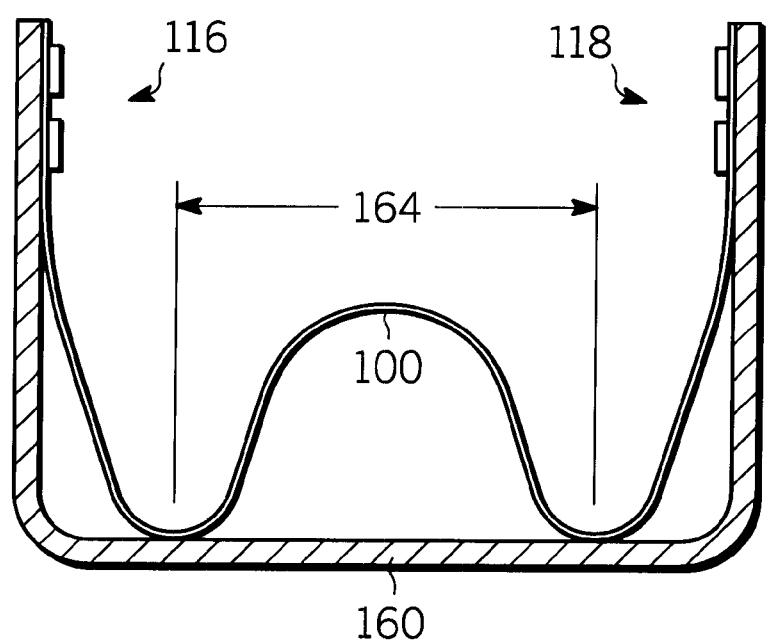
FIG. 3 is a cross sectional view of a flexible circuit board, according to the invention, that is bent.

Bending is accomplished by applying force to the flexible circuit board 100 while applying a fulcrum at or near the elongated notches 162. In one example, shown in FIG. 3, the flexible circuit board 100 may be bent. The bent flexible circuit board 100 may be placed in a u-shaped casing (not show) and the combination of the casing and the aluminum layer 160 provides an enclosure for the flexible circuit board 100. Once the flexible circuit board 100 is bent to its desired shape, it may be heated (for example, to 105° C. for about five minutes) to relieve stress.

Use of FR4 material for the non-conductive base layer 132 offers several advantages over prior art devices. For example, FR4 material is more porous than polyimide, so it does not have to be heated for as long to remove water and volatile materials, which eliminates blistering of the adhesive 154. Also, FR4 material is green and, thus, provides better contrast for optical recognition systems in detecting circuit paths on the flexible circuit board 100. Polyimide, because it is orange, offers less contrast with copper wires (which tend to be pink). Also, since the first member 116 and the second member 118 of the first circuit path portion 110 and since the third member 146 and the fourth member 148 the second circuit path portion 140 do not have to flex, there is no need for an expensive flexible solder mask to cover the board. An inexpensive rigid board solder mask may be used.

Existing modules have copper circuits on only one side of the flex area because the polyimide substrate is very flexible and the copper lines in the unsupported flex area undergo cyclic stress during vibration, whereas circuits according to the invention may include copper lines on two sides of the flexible circuit board 100. Polyimide tends not to relax after bending, whereas the multilayer flex FR4 material tends to relax into a new shape after bending, thereby minimizing the local stress on the copper lines. The FR4 material is also more rigid than polyimide, so that it will move less in vibration. This results in less cyclic stress on the copper.

The above-described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:

1. A flexible circuit having a desired bend region and at least two non-desired bend regions, the desired bend region separating the non-desired bend regions, the flexible circuit further comprising:

(a) a first circuit path portion, to at least a portion of which electronic components may be coupled, including a first resin layer and a first conductive layer, the first resin layer extending across the desired bend region and into the non-desired bend regions, the first conductive layer defining at least one first circuit path in the non-desired bend regions and further defining a first gap across the desired bend region, wherein the first circuit path portion does not have a solder mask layer in the desired bend region;

(b) a second circuit path portion, to at least a portion of which electronic components may be coupled, including a second resin layer and a second conductive layer, the second resin layer extending across the desired bend region and into the non-desired bend regions, the second conductive layer defining at least one second circuit path in the non-desired bend regions and further defining a second gap across the desired bend region, wherein the second circuit path portion does not have a solder mask layer in the desired bend region;

(c) a central circuit path portion, disposed between the first resin layer and the second resin layer, the central circuit path portion including a third conductive layer and a non-conductive base layer, the third conductive layer disposed adjacent the first resin layer, the non-conductive base layer disposed adjacent the third conductive layer, the third conductive layer electrically connected to the first conductive layer in each non-desired bend region; and (d) a metal plate affixed at the non-desired bend regions to the second circuit path portion.

2. The flexible circuit of claim 1, further comprising a fourth conductive layer disposed adjacent the second resin layer.

3. The flexible circuit of claim 1, further comprising a first solder mask layer disposed adjacent the first conductive layer opposite the first resin layer, the first solder mask layer and the first conductive layer defining the first gap across the desired bend region.

4. The flexible circuit of claim 1, further comprising a second solder mask layer disposed adjacent the second conductive layer opposite the second resin layer, the second solder mask layer and the second conductive layer defining the second gap across the desired bend region.

5. The flexible circuit of claim 1, wherein the base layer comprises FR4.

6. The flexible circuit of claim 1, wherein the base layer comprises a non-woven arimid fiber base laminate.

7. The flexible circuit of claim 1, wherein the metal plate comprises aluminum.

8. The flexible circuit of claim 1, wherein the metal plate has elongated notches that are substantially in alignment with the edges of the desired bend region.

9. The flexible circuit of claim 1, wherein the metal plate is affixed to the second circuit path portion with an adhesive.

10. A circuit board having a desired bend region and at least two non-desired bend regions, the circuit board being flexible in the desired bend region, the circuit board comprising:

a first circuit path portion having a first resin layer in the desired bend region, the first circuit path portion further having the first resin layer, a first conductive layer, and a first solder mask layer in the non-desired bend regions, wherein the first conductive layer and first solder mask layer in the non-desired bend region defines a first gap in the desired bend region;

a second circuit path portion having a second resin layer in the desired bend region, the second circuit path portion further having the second resin layer, a second conductive layer, and a second solder mask layer in the non-desired bend regions, wherein the second conductive layer and second solder mask layer in the non-desired bend region defines a second gap in the desired bend region; and a central circuit path portion disposed between the first resin layer and the second resin layer, the central circuit path portion having at least one central conductive layer that extends across the desired bend region of the circuit board to electrically connect each of the at least two non-desired bend regions.

11. The circuit board of claim 11 wherein the second mask layer in the non-desired bend region is attached to a metallic plate such that the second resin layer in the desired bend region is separated from the metallic plate by the second gap in a spaced apart relationship.

12. The circuit board of claim 10 wherein the central circuit path portion has two central conductive layers that extends across the desired bend region of the circuit board, the two central conductive layers separated by a non-conductive base layer.

13. The circuit board of claim 13 wherein the non-conductive base layer is made from an FR4 composite.

14. The circuit board of claim 13 wherein at least one of the two central conductive layers is electrically connected to the first conductive layer to provide an electrical path across the desired bend region.

15. The circuit board of claim 12 wherein at least one of the two central conductive layers is electrically connected to the second conductive layer to provide an electrical path across the desired bend region.

16. The circuit board of claim 10 further comprising a metal plate affixed to the second solder mask layer, the metal plate having elongated notches that are substantially in alignment with the edges of the desired bend region.

17. A flexible circuit board having a first side and a second side, the flexible circuit board comprising:

a desired bend region having a first resin layer, a second resin layer, and at least one central conductive layer, the at least one central conductive layer disposed between the first resin layer and the second resin layer; and at least two non-desired bend regions separated by the desired bend region, each non-desired bend region also having the first resin layer, the second resin layer, and the at least one central conductive layer, each non-desired bend region further having a first conductive layer and a first solder mask layer in the first side of the flexible circuit board, each non-desired bend region further having a second conductive layer and a second solder mask layer in the second side of the flexible circuit board;

wherein the first conductive layer and the first solder mask layer define a first gap in the first side of the flexible circuit board across the desired bend region, wherein the second conductive layer and the second solder mask layer define a second gap in the second side of the flexible circuit board across the desired bend region.

18. The flexible circuit board of claim 17 wherein the second solder mask layer in the non-desired bend region is attached to a metallic plate such that the second resin layer in the desired bend region is separated from the metallic plate by the second gap in a spaced apart relationship.

19. The flexible circuit board of claim 17 wherein the desire bend region and non-desired bend regions has two central conductive layers and a non-conductive base layer, the two central conductive layers disposed between the first resin layer and the second resin layer, the non-conductive base layer disposed between the two central conductive layers.

20. The flexible circuit board of claim 19 wherein the non-conductive base layer is made from an FR4 composite.

21. The flexible circuit board of claim 19 wherein at least one of the two central conductive layers is electrically connected to the first conductive layer.

22. The flexible circuit board of claim 19 wherein at least one of the two central conductive layers is electrically connected to the second conductive layer.

23. The flexible circuit board of claim 17 further comprising a metal plate affixed to the second solder mask layer, the metal plate having elongated notches that are substantially in alignment with the edges of the desired bend region.

* * * * *

UNITED STATES PATENT AND TRADEMARK OFFICE
CERTIFICATE OF CORRECTION

PATENT NO.   : 6,483,037 B1  
DATED        : November 19, 2002  
INVENTOR(S)  : Moore et al.

It is certified that error appears in the above-identified patent and that said Letters Patent is hereby corrected as shown below:

Column 5,  
Line 31, reads "claim 11", should read -- claim 10 --.  
Lines 41 and 43, reads "claim 13", should read -- claim 12 --.

Signed and Sealed this

Fourth Day of November, 2003

JAMES E. ROGAN  
*Director of the United States Patent and Trademark Office*